(12) United States Patent
Ohkubo

(10) Patent No.: US 6,503,811 B1
(45) Date of Patent: Jan. 7, 2003

(54) SUBSTRATE HAVING A SEMICONDUCTOR LAYER, AND METHOD FOR FABRICATING THE SAME

(75) Inventor: Yasunori Ohkubo, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/588,627

(22) Filed: Jun. 7, 2000

(30) Foreign Application Priority Data

Jun. 8, 1999 (JP) .......................................... 11-160387

(51) Int. Cl.$^7$ ................................................ H01L 21/76
(52) U.S. Cl. ........................................ 438/406; 438/479
(58) Field of Search ................................. 438/406, 479

(56) References Cited

U.S. PATENT DOCUMENTS

| | | | | |
|---|---|---|---|---|
| 4,501,060 A | * | 2/1985 | Frye et al. | 438/406 |
| 5,091,330 A | * | 2/1992 | Cambou et al. | 438/406 |
| 5,204,282 A | * | 4/1993 | Tsuruta et al. | 438/406 |
| 5,459,104 A | * | 10/1995 | Sakai | 438/406 |
| 6,303,462 B1 | * | 10/2001 | Gidon | 438/406 |

FOREIGN PATENT DOCUMENTS

| | | | | |
|---|---|---|---|---|
| EP | 000531018 A2 | * | 10/1993 | H01L/21/76 |
| JP | 05063071 | * | 3/1993 | H01L/21/76 |
| JP | 5-82633 | * | 4/1993 | H01L/21/76 |

* cited by examiner

Primary Examiner—Chandra Chaudhari
Assistant Examiner—David S Blum
(74) Attorney, Agent, or Firm—Rader, Fishman, & Grauer PLLC; Ronald P. Kananen, Esq.

(57) ABSTRACT

A method for fabricating a substrate having a semiconductor layer lowing thinning of the semiconductor layer while ensuring accuracy its thickness and a small surface roughness is provided. First, provided a patterning step in which a semiconductor substrate 1 formed on an insulating layer 4 having recesses 7 is polished to leave the semiconductor substrate 1 only in the recesses 7, and specifically, the semiconductor substrate 1 is chemically polished using the insulating layer 4 as a mask; next, provided is an etching step in which the insulating layer 4 is etched using the residual semiconductor substrate 1 as an etching mask to reduce the depth of the recesses 7; and further provided is a thinning step in which the semiconductor substrate 1 is polished, specifically by the chemical mechanical polishing, while ensuring a selectivity over the insulating layer 4 to reduce the thickness of the semiconductor substrate 1.

10 Claims, 4 Drawing Sheets

SUBSTRATE HAVING A SEMICONDUCTOR LAYER, AND METHOD FOR FABRICATING THE SAME

BACKGROUND OF THE INVENTION

1. Field of the Invention

The present invention relates to a substrate having a semiconductor layer, and a method for fabricating the same, and in particular to such a substrate having a thin-film semiconductor layer.

2. Description of the Related Art

Thin film transistor (abbreviated as TFT, hereinafter), typically used for a display control of a liquid crystal display apparatus, is formed in a so-called SOI (Silicon On Insulator) layer, that is, a semiconductor layer provided on an insulating layer. FIG. 3 is a sectional view showing an exemplary process for fabricating a substrate having an SOI layer (referred as SOI substrate, hereinafter) by the bonding method. An exemplary fabricating process thereof will be explained referring to the drawing.

First, as shown in FIG. 3A, a semiconductor substrate 101 (e.g., single crystalline silicon substrate) is etched on its first plane 101a using a resist pattern (now shown) as a mask, thereby to form recesses 103. The recesses 103 are made so as to have a depth equivalent to the thickness of an SOI layer to be formed later, so that the recesses 103 are made into approx. 100 nm thick for a desired thickness of the SOI layer of 100 nm. Next, the resist pattern is removed, and an insulating layer 104 (e.g., silicon oxide film) is then formed on the first plane 101a of the semiconductor substrate 101 so as to also fill up the recesses 103.

Next, as shown in FIG. 3B, the insulating layer 104 is polished to make a plane surface 104a, and then, as shown in FIG. 3C, a base substrate 105 is bonded onto the surface of the insulating layer 104.

Next, as shown in FIG. 3D, the semiconductor substrate 101 is lapped from its second plane 101b (opposing to the first plane 101a) to an extent not exerting damage to the surface portion along the first plane 101a, which later remains as an SOI layer, or the semiconductor substrate 101 is delaminated at a predetermined depth from the second plane 101b by the hydrogen implanting separation method.

For the case that the separation is effected by lapping, damage ascribable to the lapping is removed by polishing the semiconductor substrate 101 from the second plane 101b and then by etching by the plasma scanning method, thereby the semiconductor substrate 101 is finished so as to have a uniform thickness over the projected portion of the insulating layer 104.

Thereafter, as shown in FIG. 3E, the semiconductor substrate 101 is polished from the second plane 101b until the insulating layer 104 is exposed, thereby to leave, as an SOI layer 108, the semiconductor substrate 101 only in recesses 107 of the insulating layer 104. Here proceeded is a selective polishing ensuring a high selectivity of the semiconductor substrate 101 over the insulating layer 104. Thus an SOI substrate having on the insulating layer 104 the SOI layer 108 of approx. 100 nm thick is obtained.

In recent years, there has been growing demands for a higher integration, lower power consumption, higher voltage resistance and higher radiation resistance of semiconductor devices, which require further thinning of the SOI layer 108 to satisfy the above demands in TFT.

The method for fabricating the SOI substrate as described above is, however, disadvantageous in that, in the step for selectively polishing the semiconductor substrate 101 as shown in FIG. 3E, the semiconductor substrate 101 has to be over-polished to thoroughly expose the insulating layer 104 over the entire surface of the polishing plane. The over-polishing will thus proceed excessively in the area including the insulating layer 104 exposed earlier than the other area due to non-uniformity in the polishing rate as shown in FIG. 4, which will result in so-called dishing "A" in which the surface level of the semiconductor substrate 101 becomes lower than that of the insulating layer 104. Even when the semiconductor substrate 101 is polished at a uniform rate over the entire polishing plane, such dishing "A" is also likely to occur in the recess of the insulating layer 104 having larger opening area as shown in FIG. 5 due to an excessive over-polishing after the insulating layer 104 is exposed.

To prevent such dishing "A", chemical polishing without using abrasive grain is employed in some cases in the step corresponded to FIG. 3E. Such chemical polishing will successfully reduce the dishing "A" since the polishing of the semiconductor substrate 101 will stop upon the exposure of the insulating layer 104. Surface roughness of thus polished plane, however, increases as compared with that obtained by polishing using abrasive grain.

Substantially no problem will arise from such dishing nor surface roughness of the polished plane as for devices using an SOI layer of approx. 100 to 200 nm thick (typically for the TFT generation of a wiring width of 0.25 μm or below). It is however anticipated that degraded accuracy in the thickness or degraded crystal form of the SOI layer due to the dishing or surface roughness of the polished plane will adversely affect characteristics of devices using an SOI layer having a thickness as thin as 50 nm or below (typically for the TFT generation of a wiring width of 0.1 μm or narrower), and thus ruin the reliability of the devices.

SUMMARY OF THE INVENTION

It is therefore an object of the present invention to provide a substrate having a semiconductor layer fabricated by new method for fabricating a substrate having a semiconductor layer. It is another object of the present invention to provide a new method for fabricating a substrate having a semiconductor layer allowing thinning of the semiconductor layer while ensuring accuracy in its thickness and a small surface roughness.

A method for fabricating a substrate having a semiconductor layer of the present invention for achieving the foregoing object is proceeded as follows: first, provided is a patterning step in which a semiconductor layer formed on an insulating layer having recesses is polished to leave the semiconductor layer only in the recesses; next, provided is an etching step in which the insulating layer is etched using the residual semiconductor layer as an etching mask to reduce the depth of the recesses; and further provided is a thinning step in which the semiconductor layer is polished while ensuring a selectivity over the insulating layer to reduce the thickness of the semiconductor layer. In the patterning step of this fabrication method, the semiconductor layer is chemically polished using the insulating layer as a stopper. In the thinning step, the semiconductor layer is polished by chemical mechanical polishing while ensuring a selectivity thereof over the insulating layer.

According to such fabrication method, the semiconductor layer is left in the recesses of the insulating layer by polishing in the patterning step, the insulating layer is then etched to reduce the depth of the recesses, and the semiconductor layer projected out from the recesses is selectively polished off in the thinning step, so that the polishing in the individual steps is targeted only at the portion of the semiconductor layer projected from the surface of the insulating layer. Thus the polishing is performed so as to level the insulating layer and semiconductor layer, without requiring excessive polishing at a time in order to thin the semiconductor layer to a predetermined thickness. This suppresses non-uniform polishing and the resultant local dishing.

In the patterning step, since the semiconductor layer is polished by the chemical polishing using the insulating layer as a stopper, so that the polishing of the semiconductor layer stops upon the exposure of the insulating layer into the polishing plane and dishing due to the over-polishing is prevented from occurring. In the successive thinning step, since the semiconductor layer is polished by chemical mechanical polishing while ensuring a selectively thereof over the insulating layer, so that the polishing of the semiconductor layer can proceed with the insulating layer being exposed. In such chemical mechanical polishing, surface roughness produced on the semiconductor layer during the chemical polishing in the patterning step will successfully be removed. Here the over-polishing is unnecessary since the polishing is targeted at the already-patterned semiconductor layer, which is beneficial in preventing dishing from occurring on the polishing plane.

According to the present invention, thinning of the semiconductor layer on the insulating layer having the recesses is effected by plural times of polishing interposed by the etching of the insulating layer, where polishing amount at a time being limited, so that non-uniform polishing and the resultant local dishing are suppressed. The dishing due to over-polishing in the patterning step for exposing the insulating layer can also be suppressed by chemically polishing the semiconductor layer using the insulating layer as a stopper. The successive thinning step, in which the already-patterned semiconductor layer is selectively processed by chemical mechanical polishing, can prevent the semiconductor layer from being over-polished and thus prevent the resultant dishing from occurring, and can eliminate the surface roughness due to the chemical polishing in the patterning step.

Thus the semiconductor layer can be thinned while ensuring accuracy in its thickness and a small surface roughness. This allows device fabrication in a semiconductor layer formed as thin as 50 nm or below, for example, and device characteristics will not adversely be affected by accuracy in the thickness nor surface roughness, so that the device will be kept highly reliable.

DESCRIPTION OF THE PREFERRED EMBODIMENTS

Figure 1A:
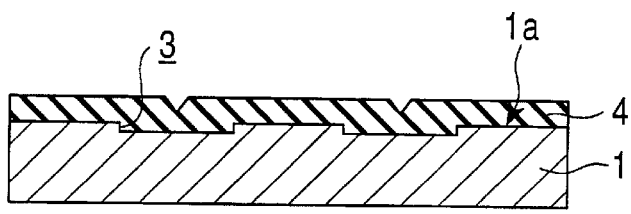
FIGS. 1A to 1F are sectional views showing by steps a fabrication method according to an embodiment of the present invention.

Preferred embodiments of the present invention will be detailed hereinafter referring to the drawings.

FIGS. 1A to 1F are sectional views showing by steps a fabrication method according to an embodiment of the present invention. An exemplary process for fabricating, based on the bonding method, a substrate having an SOI layer as a semiconductor layer will be explained hereinafter.

First, as shown in FIG. 1A, a semiconductor substrate 1 (e.g., single crystalline silicon substrate) is etched on its first plane 1a using a resist pattern (now shown) as a mask, thereby to form recesses 3. The recesses 3 are made so as to have a depth larger than the intended final thickness of an SOI layer to be obtained. For example, the depth of the recesses 3 is selected within a range of around 50 nm±5 nm for the intended SOI layer of 20 nm thick.

Next, the resist pattern is removed, and an insulating layer 4 comprising silicon oxide is then formed on the first plane 1a of the semiconductor substrate 1. The insulating layer 4 has to be such that having a thickness capable of filling up the recesses 3 on the first plane 1a of the semiconductor substrate 1. A thermal oxide film is previously formed to ensure reliability of the device using the SOI layer obtained by such process. For this, a silicon oxide film (i.e., thermal oxide film) of 100 nm thick is first formed on the first plane 1a of the semiconductor substrate 1, and then the silicon oxide film of 1 $\mu$m thick is formed by the CVD process, these silicon oxide films in together form the insulating layer 4.

Figure 1B:
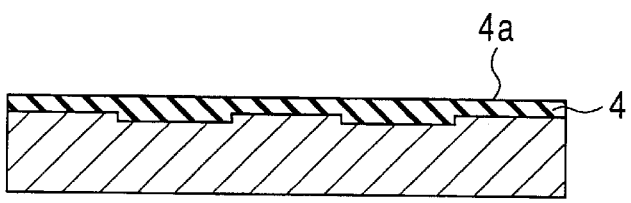

Next, as shown in FIG. 1B, a surface 4a of the insulating layer 4 is made flat by polishing. In this polishing for the flatness process, the insulating layer 4 is polished by chemical mechanical polishing to eliminate the unevenness occurring on the surface 4a thereof using a polishing pad made of a relatively hard polyurethane foam and a polishing fluid containing colloidal silica having an average particle size of 80 nm as an abrasive grain (for example, Conpol 80 (trade name), product of Fujimi Incorporated), and then finished by chemical mechanical polishing to achieve a surface roughness "Ra" of 0.4 nm or around using a polishing fluid containing colloidal silica having an average particle size of 40 nm as an abrasive grain (for example, G7008 (trade name), product of Fujimi Incorporated).

For the case of insulating layer 4 having large unevenness on its surface 4a, it is preferable to deposit polysilicon film of approx. 5 $\mu$m thick by the CVD process and then proceed the polishing for flatness processing.

Figure 1C:
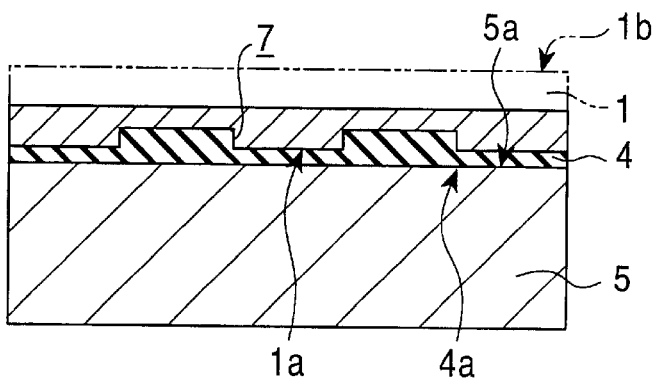

Next, as shown in FIG. 1C (in an upside-down relation to FIGS. 1A and 1B), a base substrate 5 is procured and the bonding plane 5a thereof is polished to achieve a surface roughness "Ra" of 0.4 nm or around. The surface 4a of the insulating layer 4 and the bonding plane 5a of the base substrate are subjected to RCA cleaning [cleaning with mixed solutions of ammonia ($NH_4OH$)/hydrogen peroxide ($H_2O_2$)/water ($H_2O$), and hydrochloric acid (HCl)/hydrogen peroxide ($H_2O_2$)/water ($H_2O$)], thereby to remove particles adhered on these surfaces and to introduce hydroxyl groups, which prevents bubble generation during the successive bonding.

Thereafter the base substrate 5 and the insulating layer 4 are stacked so as to oppose the bonding plane 5a of the former to the surface 4a of the latter, annealed in an oxygen or nitrogen atmosphere at 1100° C. for 30 to 120 minutes, thereby to ensure bonding of the base substrate 5 and semiconductor substrate 1 interposed with the insulating layer 4 with a high bonding strength. Non-bonded portion occurred on the periphery of the bonded product of the base substrate 5 and semiconductor substrate 1 is chamfered.

Next, the semiconductor substrate 1 is lapped from its second plane 1b to an extent not exerting damage to the portion corresponded to the surface of the SOI layer which is remained later, for example, so as to leave the semiconductor substrate 1 of approx. 7 µm thick on the insulating layer 4. The lapping in this case can be effected using, for example, a diamond lapping stone of a #2000 grade or so under a high rotation speed. While such lapping proceeds rapidly and is accurate in thickness of the lapped plane, damage may reach deep under the lapped plane and the surface roughness tends to increase.

To remove such surface roughness and damage occurred in the second plane 1b due to the lapping, the semiconductor substrate 1 is then polished from the second plane 1b by approx. 3 µm so as to leave the semiconductor substrate 1 with a thickness "t" of approx. 4 µm on the insulating layer 4. The second plane 1b of the semiconductor substrate 1 is then subjected to plasma scanning [so-called PACE (Plasma Assisted Chemical Etching) process] to level the thickness "t" of the semiconductor substrate 1 remained on the insulating layer 4. In the plasma scanning, thickness distribution of the semiconductor layer 1 remained on the insulating layer 4 is quickly measured, and a micro plasma source is scanned over the entire surface along the second plane 1b of the semiconductor substrate 1 remained on the insulating layer 4 according to the obtained thickness distribution. The thickness of the semiconductor substrate 1 over the projected portion of the insulating layer 4 is thus finished with a uniformity of 200±50 nm or around. Surface roughness of the second plane 1b at this point of time is, however, relatively large since the plasma scanning employs plasma etching to process the second plane 1b of the semiconductor substrate 1.

After bonding the base substrate 5 and semiconductor substrate 1, it is also allowable to thin the semiconductor substrate 1 by delaminating a portion adjacent to the second plane 1b of the semiconductor substrate 1 by the hydrogen implanting separation method (so-called smart cut method), in place of the lapping and the successive plasma scanning. In such a case, hydrogen ion is implanted to a predetermined depth into the semiconductor substrate 1 through the insulating layer 4 (that is, from the side of the first plane 1a), and then the semiconductor substrate 1 is annealed at approx. 400° C. by which the portion thereof adjacent to the second plane 1b is delaminated. The second plane 1b of thus obtained semiconductor substrate 1 will have a surface roughness equivalent to that obtained after the plasma scanning. Thickness of the semiconductor substrate 1 after the delamination can more accurately be controlled than in the case with the plasma scanning.

Figure 1D:
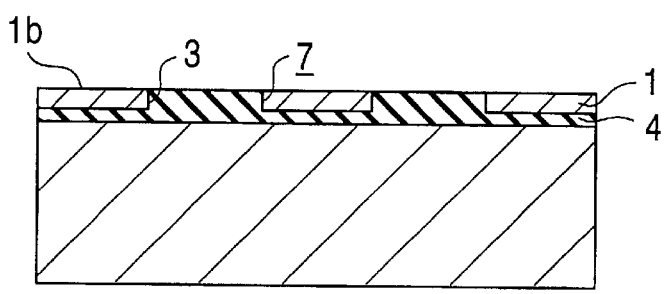

After the semiconductor substrate 1 is thinned by either method, as shown in FIG. 1D, the semiconductor substrate 1 is polished from the second plane 1b until the insulating layer 4 is exposed, thereby to leave the semiconductor substrate 1 only in recesses 7 of the insulating layer 4 (i.e., between the recesses 3 formed in the semiconductor substrate 1). Thus the semiconductor substrate 1 is patterned. Here proceeded is a chemical polishing using a polishing fluid containing no abrasive grain, by which the semiconductor substrate 1 is selectively polished while ensuring a selectivity over the insulating layer 4. The polishing is typically effected on a pad using a polishing fluid containing ethylene diamine. By such patterning (chemical polishing), the thickness of the semiconductor substrate 1 will become 50±5 nm, which is equivalent to the depth of the recesses 3 formed in the semiconductor substrate 1.

After the patterning, the thickness of the semiconductor substrate 1 remained on the insulating layer 4 is measured by interference color photometric method [using an AFT apparatus, NanoSpec (product name) manufactured by Nanometrics Japan Ltd.] to collect basic data for the successive polishing.

Figure 1E:
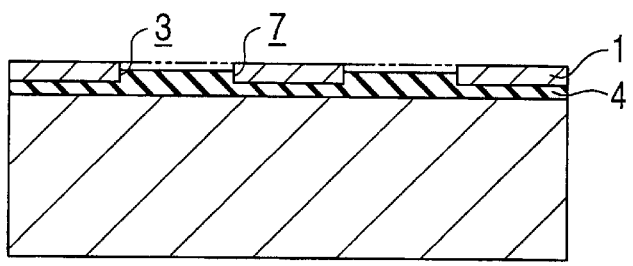
Figure 1F:
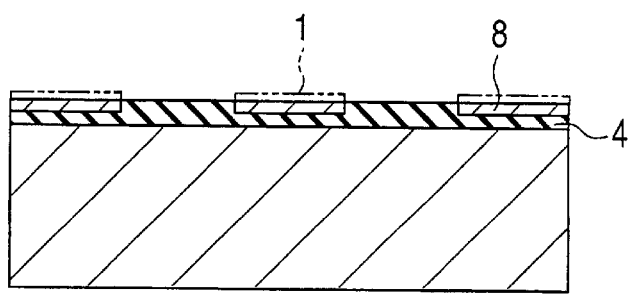

Next, as shown in FIG. 1E, the insulating layer 4 is etched off while ensuring a proper selectivity over the semiconductor substrate 1, to reduce the depth of the recesses 7 of the insulating layer 4. The dry etching is typically employed using, as an etching gas, tetrafluoromethane ($CF_4$), octafluorocyclobutane ($C_4F_8$) or trifluoromethane ($CHF_3$). Here, etching allowance is calculated as [etching allowance]= [depth of the recesses 3 of the semiconductor substrate 1 (that is, the initial depth of the recesses 7 of the insulating layer 4)]–[intended thickness of the SOI layer]. For example, obtaining an SOI layer of 20 nm thick for [depth of the recesses 3 of the semiconductor substrate 1] of 50 nm±5 nm will result in [etching allowance]=50 nm–20 nm=30 nm. After the etching, the semiconductor substrate 1 projects out from the recesses 7 of the insulating layer 4.

Next, the portion of the semiconductor substrate 1 projected from the insulating layer 4 is then removed by the second polishing, to thin the semiconductor substrate 1. Employed here is chemical mechanical polishing on a polishing pad using a polishing fluid containing abrasive grain to remove the semiconductor substrate 1 projected out from the insulating layer 4. The second polishing is to be performed so that the semiconductor substrate 1 comprising single crystalline silicon will have a selectivity of 50 or more over the insulating layer 4 comprising silicon oxide. Such chemical mechanical polishing can employ a polishing fluid containing ethylene diamine and colloidal silica (abrasive grain), which is typified by Glanzox 3900 (trade name) produced by Fujimi Incorporated. Typical examples of the polishing pad include Suba 800 and MH-S15A (both being trade names, produced by Rodel-Nitta Company).

By such second polishing, the semiconductor substrate 1 left in the recesses 7 of the insulating layer 4 is obtained as the SOI layer 8. Thickness of the SOI layer is 20 nm, which is equivalent to the depth of the recesses 7 of the insulating layer 4.

According to such fabrication method, the semiconductor substrate 1 is left in the recesses 7 of the insulating layer 4 by polishing in the patterning step, the insulating layer 4 is then etched to reduce the depth of the recesses 7, and the semiconductor substrate 1 projected out from the recesses 7 is selectively polished off, so that the polishing in the individual steps is targeted only at the portion of the semiconductor substrate 1 projected out from the surface of the insulating layer 4. Thus the polishing is performed so as to level the insulating layer 4 and semiconductor substrate 1, without requiring excessive polishing at a time in order to thin the semiconductor substrate 1 to a predetermined thickness. This suppresses non-uniform polishing and the resultant local dishing.

In the patterning step, since the semiconductor substrate 1 is chemically polished using the insulating layer 4 as a stopper, so that the polishing of the semiconductor substrate 1 stops upon the exposure of the insulating layer 4 into the polishing plane and dishing due to the over-polishing is prevented from occurring. In the successive thinning step, since the semiconductor substrate 1 is polished by chemical mechanical polishing while ensuring a selectively thereof over the insulating layer 4, so that the polishing of the semiconductor substrate 1 can proceed with the insulating layer 4 being exposed.

In such chemical mechanical polishing, surface roughness produced on the semiconductor substrate 1 during the chemical polishing in the patterning step will successfully be removed. Here the over-polishing is unnecessary since the polishing is targeted at the already-patterned semiconductor substrate 1 projected out from the insulating layer 4, which is beneficial in preventing dishing from occurring on the polishing plane.

The SOI layer 8 with a high accuracy in the thickness and a small surface roughness is thus successfully obtained, so that the device fabricated in the SOI layer 8 can be stabilized.

Figure 2:
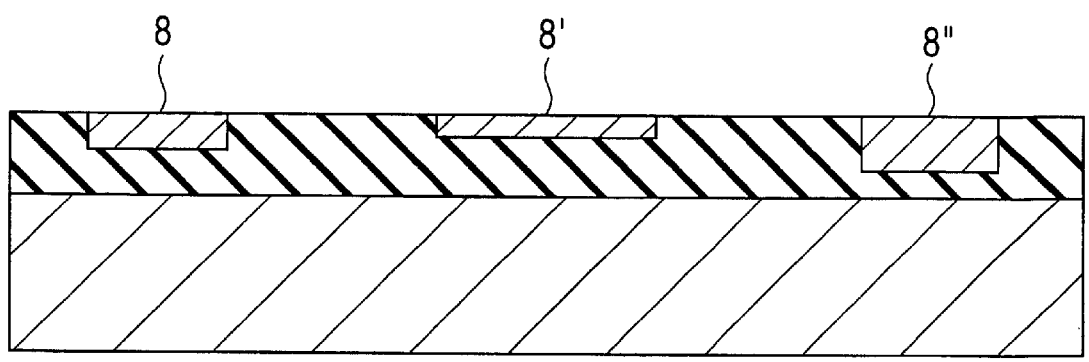
FIG. 2 is a sectional view showing another example of an SOI substrate obtained by an embodiment of the present invention.
Figure 3A:
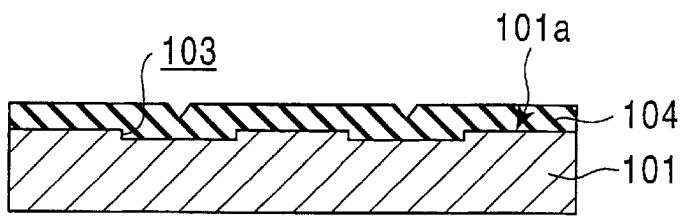
FIGS. 3A to 3E are sectional views showing by steps an example of a conventional method for fabricating an SOI substrate.
Figure 3B:
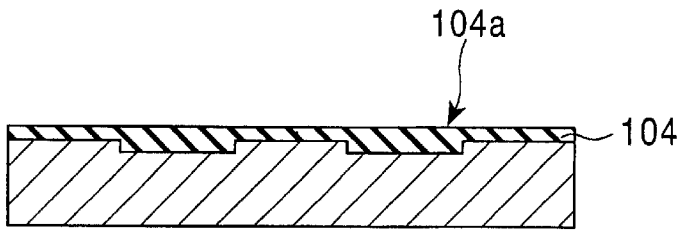
Figure 3C:
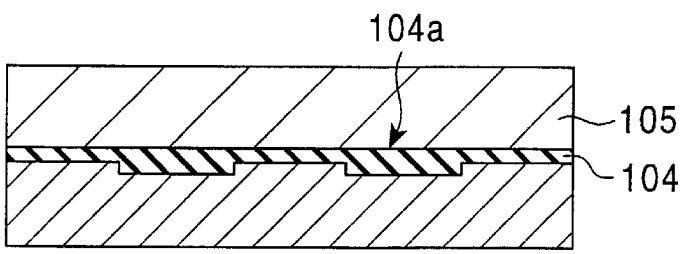
Figure 3D:
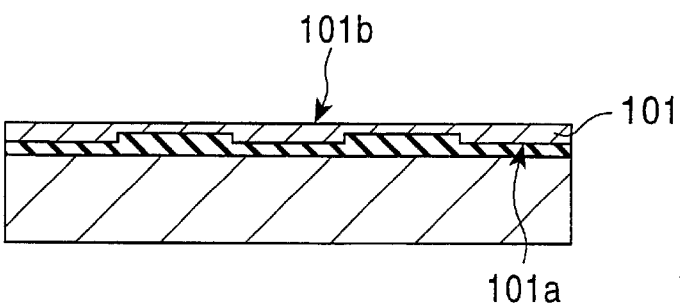
Figure 3E:
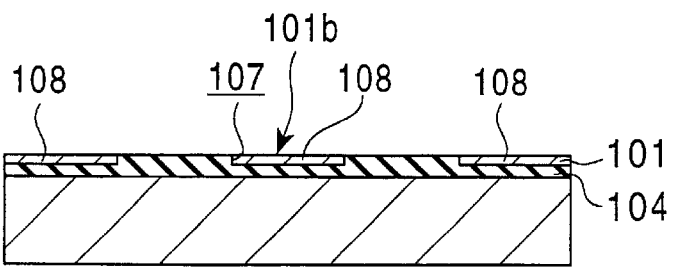
Figure 4:
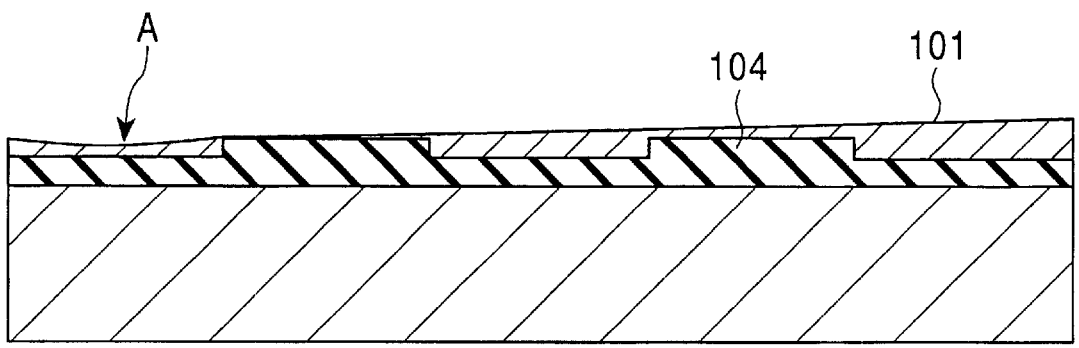
FIG. 4 is a sectional view explaining a problem in a conventional fabrication method.
Figure 5:
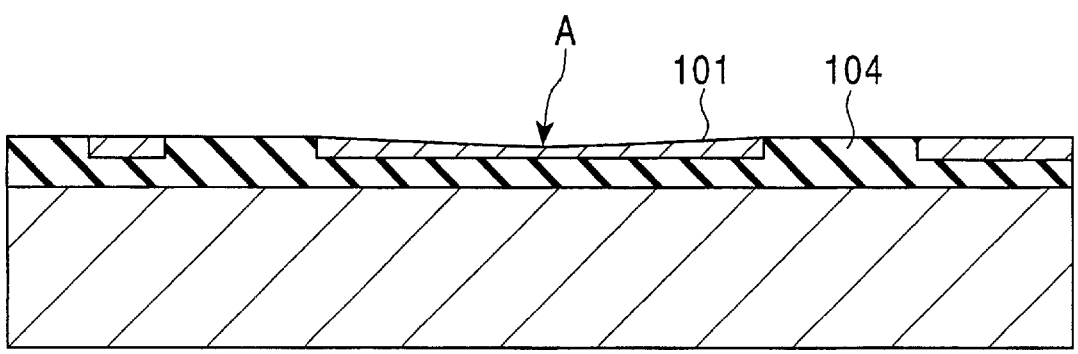
FIG. 5 is a sectional view explaining another problem in a conventional fabrication method.

While the above-described embodiment relates to a method for fabricating the SOI substrate having the SOI layer 8 of 20 nm thick, the present invention is also applicable to a method for fabricating an SOI substrate, as shown in FIG. 2 having SOI layers 8, 8' and 8" mutually differ in thickness. Such SOI substrate can be fabricated as follows: that is, in the step for forming the recesses 3 in the first plane 1a of the semiconductor substrate 1 as explained in the above embodiment referring to FIG. 1A, the recesses are formed so as to have thickness corresponded to the thickness of the individual SOI layers (8, 8' and 8") as summed up with presumed thickness losses of the insulating layer 4 during the etching step. An SOI substrate having SOI layers 8, 8' and 8" mutually differ in thickness is thus obtained.

While the above-described embodiment relates to the case involving single runs for both of etching of the insulating layer 4 and thinning of the semiconductor substrate 1 after the patterning of the semiconductor substrate 1, it is also allowable to repeat the etching of the insulating layer 4 and thinning of the semiconductor substrate 1 after the semiconductor substrate 1 is patterned. This allows reduction in the amount of chemical mechanical polishing in each run of the thinning, which can further improve accuracy in the thickness.

What is claimed is:

1. A method for fabricating a substrate having a semiconductor layer as an SOI layer, comprising:

a step for forming an insulating layer on a semiconductor substrate layer having recesses on a surface, said recesses having a depth larger than the intended final thickness of an SOI layer to be obtained, said insulating layer filling said recesses on said surface, and polishing said insulating layer on a surface opposite said recesses to form a polished surface;

bonding a base substrate on said polished surface and thinning said semiconductor substrate layer while bonded, leaving said semiconductor layer only in said recesses;

an etching step for etching the insulating layer using the residual semiconductor layer as an etching mask thereby to reduce the depth of the recesses; and a thinning step for polishing the remaining semiconductor layer while ensuring a selectivity over the insulating layer thereby to reduce the thickness of the semiconductor layer, thus to obtain an SOI substrate.

2. A method for fabricating a substrate having a semiconductor layer as claimed in claim 1, wherein, in the patterning step, the semiconductor layer is polished by chemical polishing using the insulating layer as a stopper, and in the thinning step, the semiconductor layer is polished by chemical mechanical polishing while ensuring a selectivity thereof over the insulating layer.

3. A method for fabricating a substrate having a semiconductor layer as claimed in claim 1, wherein said semiconductor layer is used for fabricating thin film transistors.

4. A method of fabricating a substrate according to claim 1 wherein said thinning step includes a step of delaminating a portion of the semiconductor substrate.

5. A method of fabricating a substrate according to claim 1 wherein said thinning step includes steps of lapping and plasma scanning.

6. A method of fabricating a substrate according to claim 2, wherein the step of chemical mechanical polishing is continued until the insulating layer is exposed to leave the semiconductor layer only in the recesses of the insulating layer.

7. A method of fabricating a substrate according to claim 1 wherein the thickness of the semiconductor substrate left in the recesses of the insulating layer is about 8 to 20 nm.

8. A method of fabricating a substrate according to claim 1 wherein the thicknesses in a respective plurality of said recesses are mutually different.

9. A method of fabricating a substrate having a semiconductor layer on an insulating layer to form an SOI substrate, comprising the steps of:

providing a composite of a semiconductor substrate layer having recesses thereon with a depth greater than an intended final SOI layer, an insulating layer on said layer with recesses of said semiconductor substrate layer and having a polished surface opposite the surface adjacent to said semiconductor surface, with a base substrate bonded to said polished surface;

thinning and polishing said semiconductor substrate until said semiconductor substrate is only within recesses in the insulating layer corresponding to recesses in said semiconductor layer, said polishing step being chemical polishing until the thickness of the semiconductor substrate remaining on the insulating layer is about the depth of the recesses formed in the semiconductor substrate;

etching said insulating layer while ensuring a proper selectivity over the semiconductor substrate to reduce the depth of the recesses of the insulating layer; and removing portions of the semiconductor substrate projected from the insulating layer by a second polishing, thus providing an SOI layer equivalent to the depth of the recesses of the insulating layer.

10. A method for fabricating a substrate having a semiconductor layer as an SOI layer, comprising:

a patterning step for polishing a semiconductor substrate layer on an insulating layer together secured to a base substrate at a surface of said insulating layer, each of said semiconductor substrate layer and said insulating layer having recesses, a depth of said recesses in said semiconductor substrate layer being greater that the intended final thickness of said SOI layer to be obtained, said polishing of said patterning step leaving the semiconductor substrate layer only in the recesses;

an etching step for etching the insulating layer using the residual semiconductor substrate layer as an etching mask thereby to reduce the depth of the recesses of both said semiconductor substrate layer and said insulating layer;

a thinning step for polishing the semiconductor substrate layer while ensuring a selectivity over the insulating layer thereby to reduce the thickness of the semiconductor substrate layer, thus to obtain an SOI substrate.

* * * * *

UNITED STATES PATENT AND TRADEMARK OFFICE
CERTIFICATE OF CORRECTION

PATENT NO. : 6,503,811 B1 Page 1 of 1
DATED : January 7, 2003
INVENTOR(S) : Yasunori Ohkubo It is certified that error appears in the above-identified patent and that said Letters Patent is hereby corrected as shown below:

Title page,
Item [57], ABSTRACT,
Line 2, "lowing" should read -- allowing --.
Line 4, "First. provided"should read -- First, provided is --.

Column 8,
Line 53, "that" should read -- than --.

Signed and Sealed this

Twenty-second Day of April, 2003

JAMES E. ROGAN
*Director of the United States Patent and Trademark Office*